United States Patent [19]
Iguchi et al.

[11] Patent Number: 5,397,734
[45] Date of Patent: Mar. 14, 1995

[54] METHOD OF FABRICATING A SEMICONDUCTOR DEVICE HAVING A TRIPLE WELL STRUCTURE

[75] Inventors: Katsuji Iguchi, Yamatokoriyama; Makoto Tanigawa, Kitakatsuragi, both of Japan

[73] Assignee: Sharp Kabushiki Kaisha, Osaka, Japan

[21] Appl. No.: 955,997

[22] Filed: Oct. 2, 1992

[30] Foreign Application Priority Data

Oct. 8, 1991 [JP] Japan .................................. 3-260821

[51] Int. Cl.⁶ .................................... H01L 21/76
[52] U.S. Cl. .................... 437/70; 437/149; 437/52; 437/952; 437/924
[58] Field of Search ............... 437/70, 149, 52, 924, 437/952; 148/DIG. 85, DIG. 86

[56] References Cited

U.S. PATENT DOCUMENTS 5,157,003 10/1992 Tsuji et al. .......................... 437/924
5,294,556 3/1994 Kawamura ........................ 437/924

FOREIGN PATENT DOCUMENTS 1248637 10/1989 Japan .
2155228 6/1990 Japan .
3-110864 5/1991 Japan .

Primary Examiner—George Fourson
Attorney, Agent, or Firm—Nixon & Vanderhye P.C.

[57] ABSTRACT

A method of fabricating a semiconductor device having a p-type semiconductor substrate and a p-well for memory cells which is formed in the substrate is disclosed. N-type impurities are implanted into a region of the substrate in which the p-well for memory cells is to be formed. Then, the region is selectively and thermally oxidized to form an oxide film on the first region, and the n-type impurities are simultaneously diffused in the substrate. After the oxide film is removed, the p-well is formed within the region of the substrate in which the n-type impurities are diffused.

6 Claims, 4 Drawing Sheets

METHOD OF FABRICATING A SEMICONDUCTOR DEVICE HAVING A TRIPLE WELL STRUCTURE

BACKGROUND OF THE INVENTION

1. Field of the Invention

The present invention relates to a method of fabricating a semiconductor device, and more particularly to a method of fabricating a semiconductor device having a triple well (tub) structure.

2. Description of the Prior Art

When a dynamic random access memory (DRAM) is fabricated utilizing a p-type substrate by a conventional method, an n-channel MOS transistor for a memory cell section and an n-channel and p-channel MOS transistors for a peripheral circuit section are sometimes formed in different wells. Such a structure has various advantages in that: any noise caused in the peripheral circuit section does not affect the memory cell section; a substrate bias of the memory cell section can be controlled independently of the peripheral circuit section; a short-channel effect of the transistor for the peripheral circuit section can easily be controlled, and a substrate bias generating circuit can be made smaller.

However, in order to form an n-channel MOS transistor for a memory cell section and an n-channel and p-channel MOS transistors for a peripheral circuit section in different wells, a p-well of the memory cell section must be separated from the p-type silicon substrate. As a result, it is necessary to form an n-well which is larger in depth than the p-well so as to cover the p-well of the memory cell section, thereby forming a triple well structure.

Additionally, in a stacked DRAM, since a memory cell capacitor is formed over a switching transistor in each memory cell, the level of the memory cell section is higher than that of the surrounding area (the peripheral circuit section). Because of this change in level, it is sometimes difficult to interconnect the memory cell section and the peripheral circuit section through conductive lines (wirings). As a countermeasure to such a disadvantage, the level of the memory cell section only is made lower, so that the change in level made by the memory cell section and the peripheral circuit section is reduced.

In the above-mentioned conventional method of fabricating a semiconductor device, it is possible to reduce the change in level made by the memory cell section and the peripheral circuit section in order to prevent a disconnection (opening) and short on the conductive lines from occurring. However, this necessitates additional process steps of initially making the level of the semiconductor substrate lower and of forming a plurality of wells, so that there arises another problem in that the fabrication process becomes complicated.

SUMMARY OF THE INVENTION

The method of fabricating a semiconductor device having a semiconductor substrate of a first conductivity type and a first well of the first conductivity type which is formed in the semiconductor substrate according to this invention, comprises the steps of: selectively implanting impurities of a second conductivity type into a first region of the semiconductor substrate in which the first well is to be formed; selectively and thermally oxidizing the first region to form an oxide film on the first region, and diffusing the impurities of the second conductivity type in the semiconductor substrate, thereby forming a deep diffusion; removing the oxide film; and forming the first well of the first conductivity type within the deep diffusion in which the impurities of the second conductivity type are diffused.

Thus, the invention described herein makes possible the advantages of (1) providing a method of fabricating a semiconductor device in which the change in level of the semiconductor substrate on which elements are formed is reduced, and (2) providing a method of fabricating such a semiconductor device by a simplified process sequences.

These and other advantages of the present invention will become apparent to those skilled in the art upon reading and understanding the following detailed description with reference to the accompanying figures.

DESCRIPTION OF THE PREFERRED EMBODIMENTS

Figure 1:
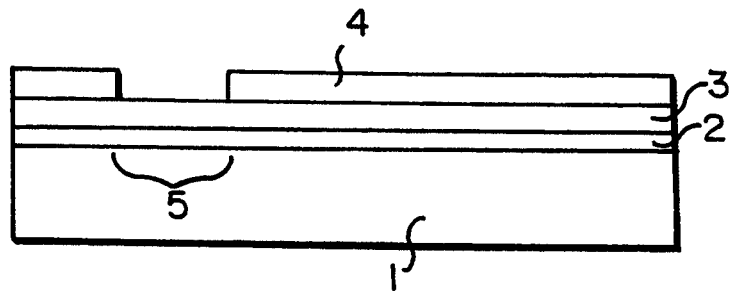
FIGS. 1 through 8 are schematic sectional views showing a process sequence of fabricating a semiconductor device according to the invention.

Referring to FIGS. 1 through 8, exemplary process steps according to the method of the invention for fabricating a semiconductor device which has a p-type silicon substrate (a semiconductor substrate of a first conductivity type) 1 and a p-well 17 for memory cells formed in the semiconductor substrate 1 will be described.

First, by thermally oxidizing the surface of the semiconductor substrate i at a temperature in the range of 900° C. to 1000° C., a silicon oxide film 2 is formed on the semiconductor substrate 1. As the semiconductor substrate 1, it is preferable to use a (100) single crystal silicon substrate doped with p-type impurities. The thickness of the silicon oxide film 2 is typically 50 to 200 nm. Next, by a chemical vapor deposition (CVD) method using $NH_3$ and $SiH_2Cl_2$ as a source gas, a silicon nitride film 3 is deposited on the silicon oxide film 2. The thickness of the silicon nitride film 3 is typically 80 to 200 nm.

A resist pattern 4 having at least one opening is formed on the silicon nitride film 3, as shown in FIG. 1. The resist pattern 4 is formed using a usual lithography technique. The shape and the position of the opening define the shape and the position of an n-well which is formed in a later process step. The shape and the position of the opening are selected design matters. In the surface region of the semiconductor substrate 1, a region (a first region) corresponding to the opening is designated by the reference numeral 5 in FIG. 1.

Figure 2:
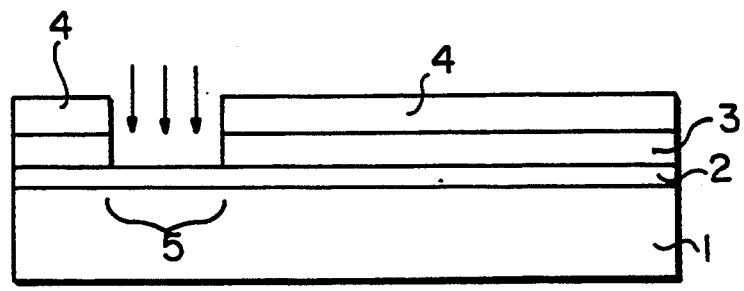

An exposed portion of the silicon nitride film 3 which is not covered with the resist pattern 4 is selectively etched using the resist pattern 4 as a mask. Thus, an opening corresponding to the opening of the resist pattern 4 is formed in the silicon nitride film 3, as shown in FIG. 2. By anisotropically etching, the size of the opening of the silicon nitride film 3 is substantially the same as that of the opening of the resist pattern 4.

Next, before removing the resist pattern 4, phosphorus ions in a dose of $1 \times 10^{12}$ to $1 \times 10^{13}$ cm$^{-2}$ are implanted into the first region 5 of the semiconductor substrate 1 via the opening of the resist pattern 4 and the silicon nitride film 3. The acceleration energy for implantation is adjusted such that the phosphorus ions can reach a desired depth of the semiconductor substrate 1 through the silicon oxide film 2. In this example, a portion of the silicon oxide film 2 which covers the first region 5 is intentionally not removed by etching. Alternatively, before or after the ion implantation, an exposed portion of the silicon oxide film 2 via the opening of the resist pattern 4 and the silicon nitride film 3 may be selectively etched.

Figure 3:
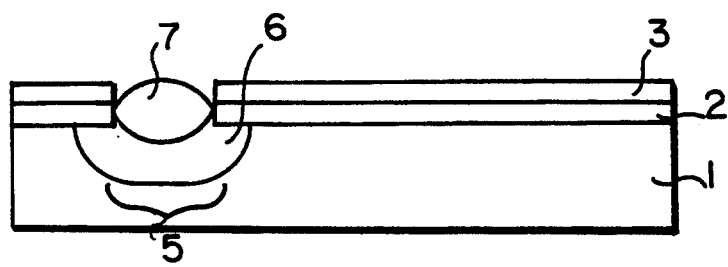

Then, the semiconductor substrate 1 is thermally treated in an oxidizing gas atmosphere, so that the first region 5 of the semiconductor substrate 1 is selectively oxidized. By this oxidization, a selective oxide film 7 is formed to a thickness of 500 to 1200 nm in the first region 5, as shown in FIG. 3. The thermal treatment is typically conducted at a temperature of 1100° to 1200° C. for a time period of 150 to 4000 minutes. As the oxidizing gas, an oxygen gas (dry) or a water vapor (wet) is preferably used.

By this thermal treatment, the phosphorus ions which have been implanted in the first region 5 are diffused in the semiconductor substrate 1, so as to form a deep n-well (deep diffusion) 6 to a depth of 3 to 5 $\mu$m in the semiconductor substrate 1, as shown in FIG. 3. As described above, the selective oxide film 7 and the n-well 6 are simultaneously formed.

In this thermal treatment (local oxidization) step, alignment marks of local oxide films are formed in scribe line portions (not shown) or empty portions (not shown) on the semiconductor substrate 1. The alignment marks are used for aligning the relative positions of the semiconductor substrate 1 and a mask for patterning in a lithography step.

Figure 4:
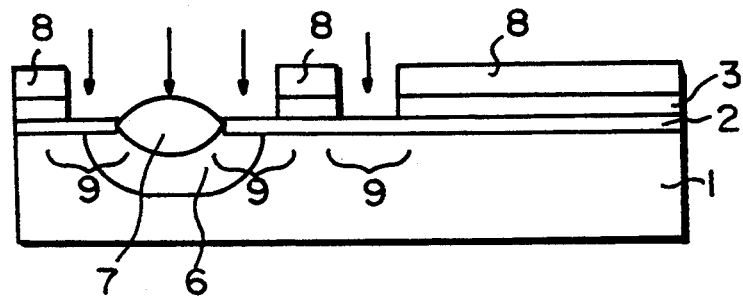

Then, a resist pattern 8 having openings is formed on the silicon nitride film 3, as shown in FIG. 4. The resist pattern 8 is formed using the usual lithography technique. The shape and the position of each of the openings define the shape and the position of n-wells 10 (FIG. 5) which are formed in a later process step. The shape and the position of each of the openings and the number of the openings are selected design matters. In this example, the size of one of the openings is larger than that of the opening of the resist pattern 4.

Exposed portions of the silicon nitride film 3 which are not covered with the resist pattern 8 are selectively etched using the resist pattern 8 as a mask. Thus, openings are formed in the silicon nitride film 3 corresponding to the openings of the resist pattern 8. By anisotropically etching, the size of the opening of the silicon nitride film 3 is substantially the same as that of the opening of the resist pattern 8.

Next, before removing the resist pattern 8, phosphorus ions in a dose of $0.4 \times 10^{13}$ to $4 \times 10^{13}$ cm$^{-2}$ are implanted into a second region 9 of the semiconductor substrate 1 via the openings of the resist pattern 8 and the silicon nitride film 3. The acceleration energy for implantation is adjusted such that the phosphorus ions can reach a desired depth of the semiconductor substrate 1 through the silicon oxide film 2.

Figure 5:
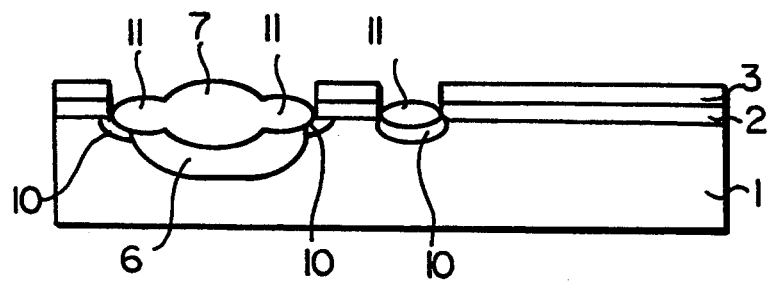

After the resist pattern 8 is removed, the semiconductor substrate 1 is thermally treated in an oxidizing gas atmosphere, so that the exposed portions of the semiconductor substrate 1 are selectively oxidized. By this oxidization, selective oxide films 11 are selectively formed to a thickness of 300 to 500 nm on the semiconductor substrate 1, as shown in FIG. 5. The thermal treatment is typically conducted at a temperature of 900° C. to 1100° C. for a time period of 20 to 600 minutes. As the oxidizing gas, an oxygen gas or a water vapor is preferably used. By this thermal treatment, the implanted phosphorus ions are diffused in the semiconductor substrate 1, so that the n-wells 10 having a depth of 0.1 to 0.3 $\mu$m are formed in the semiconductor substrate 1. Thus, the selective oxide films 11 and the n-wells 10 are simultaneously formed.

Figure 6:
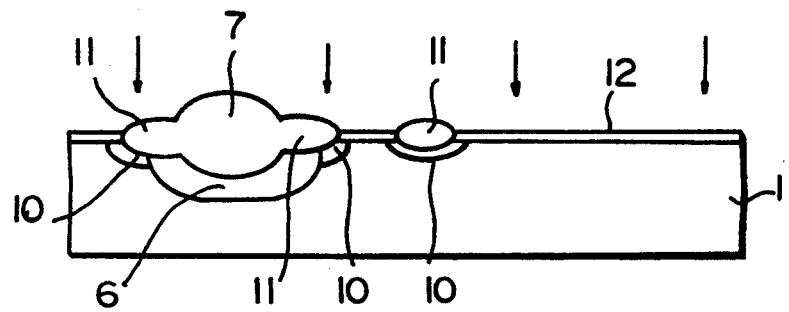

The semiconductor substrate 1 is immersed in a hot phosphoric acid bath, so that the silicon nitride film 3 is removed. Then, the semiconductor substrate 1 is cleaned and the silicon oxide film 2 is removed. Thereafter, the semiconductor substrate 1 is oxidized so as to form a silicon oxide film 12 having a thickness of 10 to 30 nm on a portion of the semiconductor substrate 1 on which the selective oxide films 7 and 11 are not formed, as shown in FIG. 6. Then, boron ions in a dose of $0.4 \times 10^{13}$ to $4 \times 10^{13}$ cm$^{-2}$ are implanted into the entire surface of the semiconductor substrate 1.

Then, all of the silicon oxide films on the semiconductor substrate 1, i.e., the selective oxide films 7 and 11 and the silicon oxide film 12 are removed using a hydrofluoric acid solution. A silicon oxide film 13 having a thickness of 10 to 30 nm is formed on the silicon substrate 1.

Figure 7:
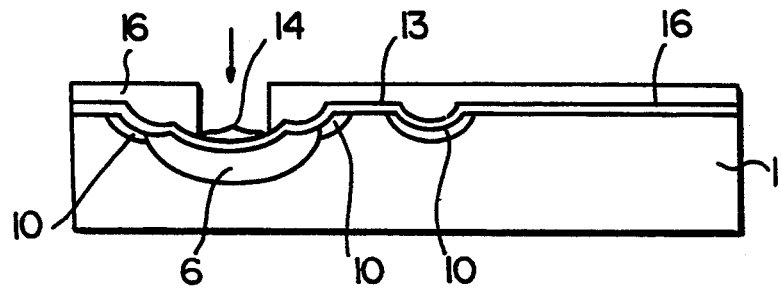

A resist pattern 16 having an opening is formed on the silicon oxide film 13, as shown in FIG. 7. The resist pattern 16 is formed using the usual lithography technique. The shape and the position of each of the openings define the shape and the position of a p-well 17 (FIG. 8) for memory cells which is formed in a later process step. In this example, the shape and the position of the p-well 17 are selected such that the n-well 6 completely includes the p-well 17. Then, boron ions in a dose of $0.4 \times 10^{13}$ to $4 \times 10^{13}$ cm$^{-2}$ are implanted into the semiconductor substrate 1 using the resist pattern 16 as a mask.

Figure 8:
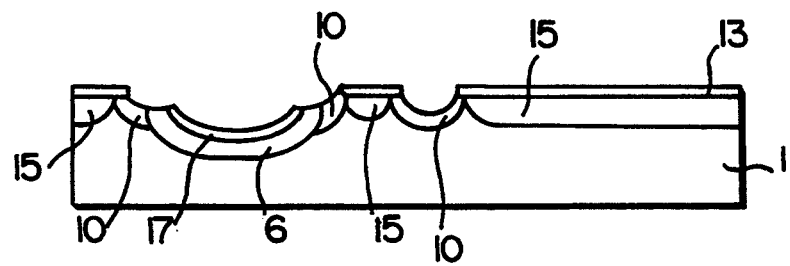

Then, after the resist pattern 16 is removed, a diffusion step is performed at a temperature of 1050° C. to 1150° C., so that a shallow p-well 17 in the deep n-well 6 and shallow p-wells 15 are formed, as shown in FIG. 8. The shallow p-well 17 in the deep n-well 6, the shallow p-wells 15, and the shallow n-wells 10 form a triple well structure.

Each of the shallow p-wells 17 and the shallow p-wells 15 preferably has a depth of 0.7 to 2 $\mu$m.

In this example, it is desirable to form the shallow n-wells 10 at the margin of the deep n-well 6. By forming the shallow n-wells 10 in such a manner, the electrical contact with the deep n-well 6 can be ensured, and moreover the change in level of the semiconductor substrate 1 which is caused during the thermal oxidization of the deep n-well 6 can be eased.

In the selective oxidization step in this example, the thickness of the selective oxide films 7 and 11 can be controlled by adjusting the oxidizing temperature and the amounts of water and oxygen in the oxidizing atmosphere. The atmosphere can be changed in mid course.

Figure 9:
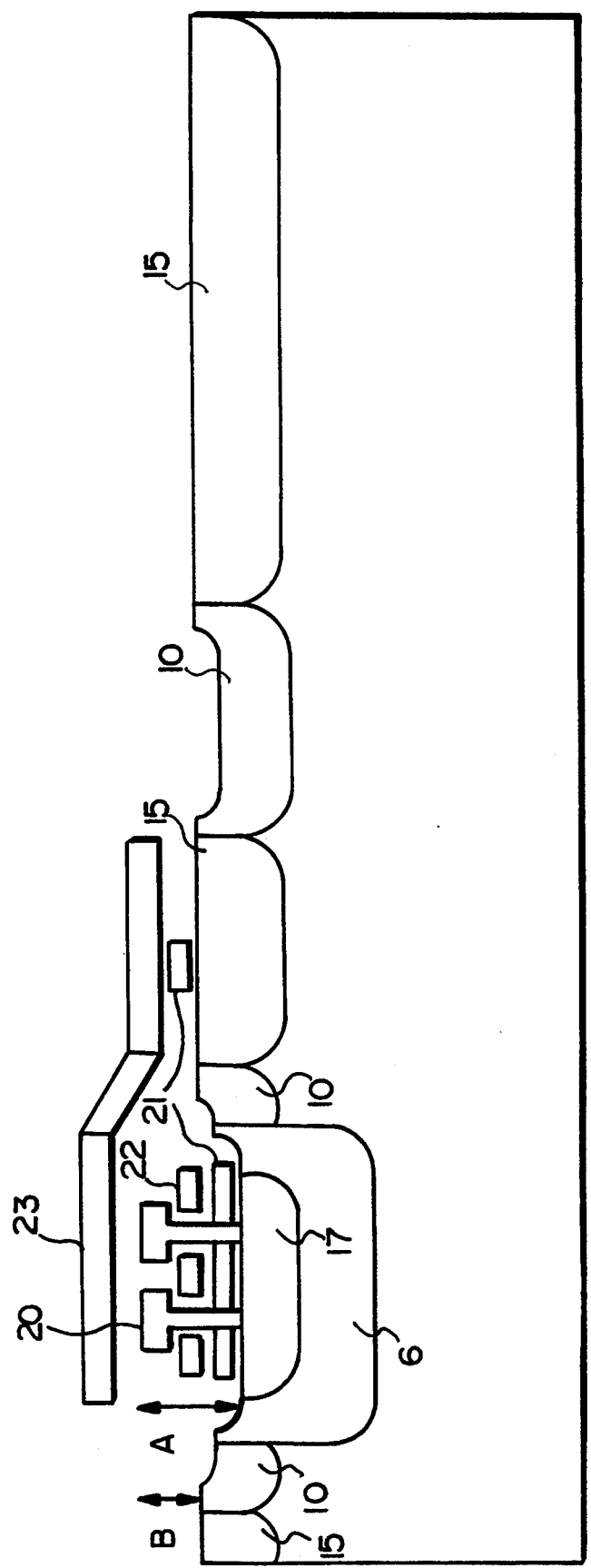
FIG. 9 is a schematic sectional view showing a semiconductor device fabricated according to the invention, with wirings and capacitors provided thereon.

FIG. 9 schematically shows wirings 21, 22 and 23, and a stacked capacitor 20 which are provided on the thus formed p-wells 15 and 17. The wiring 21 is a word line, the wiring 22 a bit line, and the wiring 23 an Al interconnection. At the p-well 15, a transistor for a peripheral circuit is formed. At the p-well 17, a plurality of memory cells each having the stacked capacitor 20 are formed. The letter A in FIG. 9 denotes a height of a memory cell above the surface level of the p-well 17, and the letter B denotes a height of the memory cell above the surface level of the p-well 15. In this example, as seen from FIG. 9, a relationship of B<A is achieved. As a result, the height of the step under the wiring 23 can be reduced by (A−B). By adequately selecting a thickness of the selective oxide film 7 to be removed depending on the height A of the memory cell, the step (B−A) can be made within a required range.

Figure 10A:
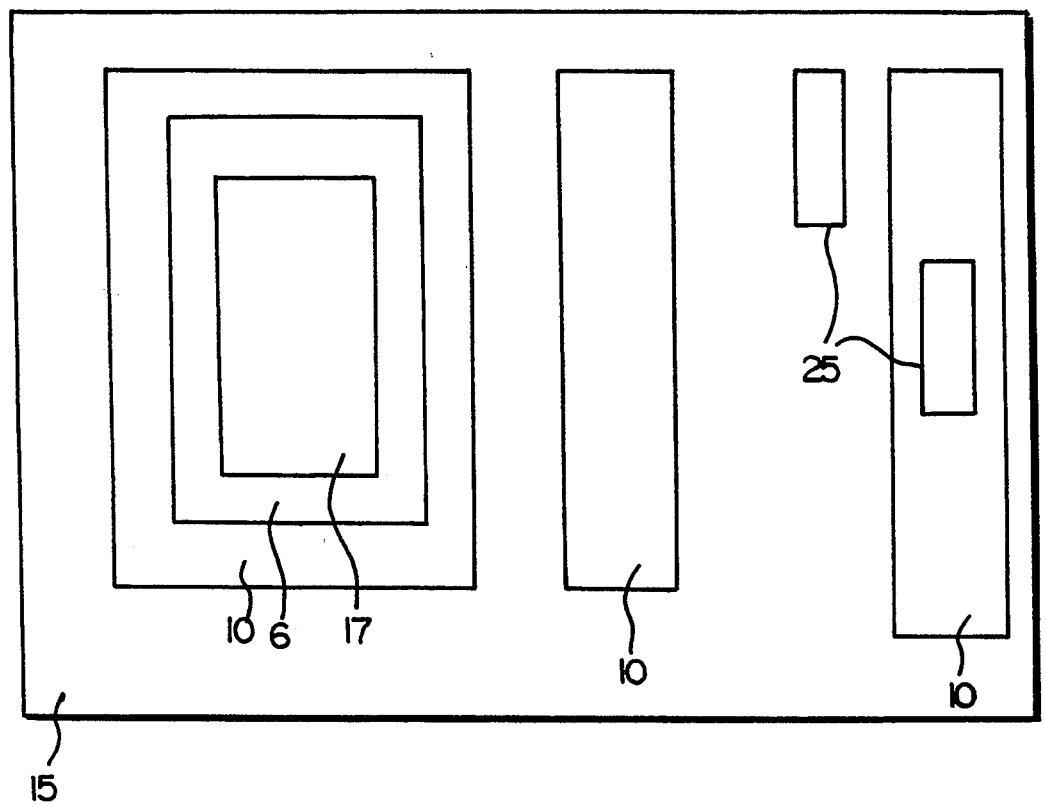
FIG. 10A is a plan view showing a layout of a semiconductor device fabricated according to the invention.
Figure 10B:
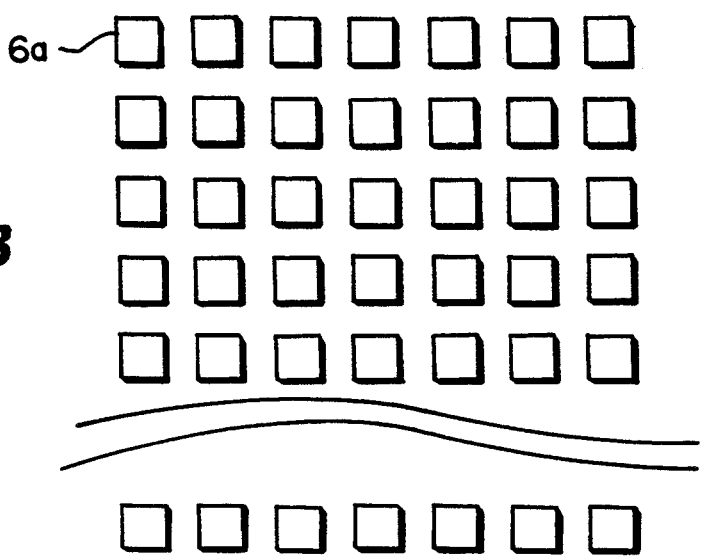
FIG. 10B is an enlarged view showing an alignment mark.

FIG. 10A shows an exemplary plan layout of a semiconductor device fabricated by the method of this example. In this layout, each of the n-wells 10 is surrounded by the p-well 15. One of the n-wells 10 surrounds the deep n-well 6 having the shallow p-well 17 therein. Alignment marks 25 are formed in the areas of the p-well 15 and one of the n-wells 10. FIG. 10B is an enlarged view of the alignment mark 25. The alignment mark 25 is formed using the opening shown in FIG. 2 at the same time as the selective oxide film 7 is formed. In other words, components 6a of the alignment mark 25 are formed in a similar manner to the formation of the deep n-well 6. Therefore, the arrangement of the components 6a of the alignment mark 25 is determined by a mask pattern used for defining the shape of the selective oxide film 7.

As described above, according to this example, a region of a semiconductor substrate in which a well is to be formed is selectively oxidized. The oxide film is then removed by etching or other techniques, so that the region of the semiconductor substrate is made lower than the surrounding region. Therefore, when a transistor, a capacitor and the like are formed in a later process step, and the surface of the semiconductor substrate becomes higher, the height of the resulting change in level is considerably reduced with respect to the peripheral circuit section. As a result, the focus point can be easily determined in a later exposure step for forming an aluminum interconnection or the like.

In accordance with the invention, when a set of process steps of ion-implanting impurities into a region of a semiconductor substrate in which a well is to be formed and of diffusing the implanted ions and simultaneously forming a selective oxide film is repeated two or more times, a nitride film which is first used for forming a selective oxide film can be utilized in a later process step. The diffusion of implanted ions and the formation of the selective oxide film are performed in the same process step. Whereby the fabrication process can be simplified.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of fabricating a semiconductor device having a semiconductor substrate of a first conductivity type and a first well of the first conductivity type which is formed in the semiconductor substrate, the method comprising the steps of:

forming an anti-oxidation film on the semiconductor substrate;

selectively removing the anti-oxidation film in a first region of the semiconductor substrate in which the first well is to be formed;

selectively implanting impurities of a second conductivity type into the first region of the semiconductor substrate;

selectively and thermally oxidizing the first region to form an oxide film on the first region and diffusing the impurities of the second conductivity type in the semiconductor substrate, thereby forming a deep diffusion including the impurities of the second conductivity type;

selectively removing the anti-oxidation film in a second region of the semiconductor substrate in which a second well of the second conductivity type is to be formed;

implanting the impurities of the second conductivity type into the second region of the semiconductor substrate;

selectively and thermally oxidizing the second region to form another oxide film on the second region and diffusing the impurities of the second conductivity type in the semiconductor substrate, thereby forming the second well including the impurities of the second conductivity type, the second well being formed adjacent to the deep diffusion but having a depth which is smaller than that of the deep diffusion;

removing the oxide films on the first and second regions so as to make the top surface of the first region lower than the top surface of second region; and forming the first well of the first conductivity type within the deep diffusion.

2. A method according to claim 1, wherein the method further comprises a step of forming a third well of the first conductivity type in a third region excluding the first and second regions of the semiconductor substrate.

3. A method of fabricating a semiconductor device having a semiconductor substrate of a first conductivity type and a first well of the first conductivity type which is formed in the semiconductor substrate, the method comprising the steps of:

forming an anti-oxidation film on the semiconductor substrate;

selectively removing the anti-oxidation film in a first region of the semiconductor substrate in which the first well is to be formed;

selectively implanting impurities of a second conductivity type into the first region of the semiconductor substrate;

selectively and thermally oxidizing the first region to form an oxide film on the first region and diffusing the impurities of the second conductivity type in the semiconductor substrate, thereby forming a deep diffusion including the impurities of the second conductivity type;

selectively removing the anti-oxidation film in a second region of the semiconductor substrate in which a second well of the second conductivity type is to be formed;

implanting the impurities of the second conductivity type into the second region of the semiconductor substrate;

selectively and thermally oxidizing the second region to form another oxide film on the second region and diffusing the impurities of the second conductivity type in the semiconductor substrate, thereby forming the second well including the impurities of the second conductivity type, wherein part of the second well is in contact with the deep diffusion;

removing the oxide films on the first and second regions, and;

forming the first well of the first conductivity type within the deep diffusion.

4. A method of fabricating a semiconductor device having a semiconductor substrate of a first conductivity type and a first well of the first conductivity type which is formed in the semiconductor substrate, the method comprising the steps of:

forming an anti-oxidation film on the semiconductor substrate;

selectively removing the anti-oxidation film in a first region of the semiconductor substrate in which the first well is to be formed;

selectively implanting impurities of a second conductivity type into the first region of the semiconductor substrate;

selectively and thermally oxidizing the first region to form an oxide film on the first region and diffusing the impurities of the second conductivity type in the semiconductor substrate, thereby forming a deep diffusion including the impurities of the second conductivity type;

selectively removing the anti-oxidation film in a second region of the semiconductor substrate in which a second well of the second conductivity type is to be formed;

implanting the impurities of the second conductivity type into the second region of the semiconductor substrate;

selectively and thermally oxidizing the second region to form another oxide film on the second region and diffusing the impurities of the second conductivity type in the semiconductor substrate, thereby forming the second well including the impurities of the second conductivity type, the second well surrounding the deep diffusion;, removing the oxide films on the first and second regions; and forming the first well of the first conductivity type within the deep diffusion.

5. A method according to claim 1, wherein an alignment mark is formed on the semiconductor substrate when the oxide film on the first region is formed, the alignment mark being used for alignment thereafter.

6. A method according to claim 1, wherein the semiconductor device is a memory device, the method further comprising the steps of:

forming a memory cell in the deep diffusion; and forming a peripheral circuit on the semiconductor substrate excluding the deep diffusion.

* * * * *